United States Patent
Camacho et al.

(10) Patent No.: US 8,354,742 B2
(45) Date of Patent: Jan. 15, 2013

(54) METHOD AND APPARATUS FOR A PACKAGE HAVING MULTIPLE STACKED DIE

(75) Inventors: Zigmund R. Camacho, Singapore (SG); Jairus Legaspi Pisigan, Singapore (SG); Lionel Chien Hui Tay, Singapore (SG); Henry D. Bathan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 1325 days.

(21) Appl. No.: 12/060,115

(22) Filed: Mar. 31, 2008

(65) Prior Publication Data
US 2009/0243064 A1    Oct. 1, 2009

(51) Int. Cl.
*H01L 23/02* (2006.01)
(52) U.S. Cl. ......... 257/680; 257/E23.116; 257/E21.499; 438/109
(58) Field of Classification Search .......... 257/680, 257/E23.116, E21.499; 438/109
See application file for complete search history.

(56) References Cited

U.S. PATENT DOCUMENTS

| | | | |
|---|---|---|---|
| 5,422,435 A | 6/1995 | Takiar et al. | |
| 6,278,616 B1 * | 8/2001 | Gelsomini et al. | 361/803 |
| 6,894,378 B2 * | 5/2005 | Winderl | 257/686 |
| 7,619,305 B2 * | 11/2009 | Fan et al. | 257/686 |
| 7,735,225 B2 * | 6/2010 | Nystrom et al. | 29/890.1 |
| 2003/0100174 A1 * | 5/2003 | Chiu et al. | 438/612 |
| 2006/0244157 A1 | 11/2006 | Carson | |
| 2007/0096341 A1 | 5/2007 | Chung et al. | |
| 2008/0083981 A1 * | 4/2008 | Romig et al. | 257/707 |

* cited by examiner

*Primary Examiner* — Pho M Luu
(74) *Attorney, Agent, or Firm* — Robert D. Atkins; Patent Law Group: Atkins & Associates, P.C.

(57) ABSTRACT

A method of manufacturing a semiconductor package involves providing a substrate having a window. The substrate may include a leadframe having half-etched leads. First and second semiconductor devices are mounted to a top surface of the substrate on either side of the window using an adhesive. A third semiconductor device is mounted to the first and second semiconductor devices using an adhesive. The third semiconductor device is disposed over the window of the substrate. A wirebond or other electrical interconnect is formed between the third semiconductor device and a contact pad formed over a bottom surface of the substrate opposite the top surface of the substrate. The wirebond or other electrical interconnect passes through the window of the substrate. An encapsulant is deposited over the first, second, and third semiconductor devices.

30 Claims, 14 Drawing Sheets

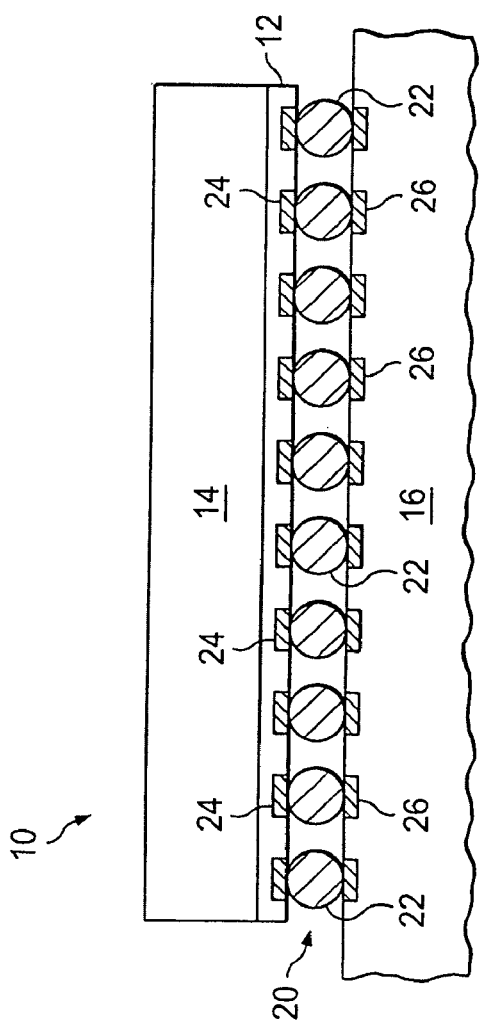
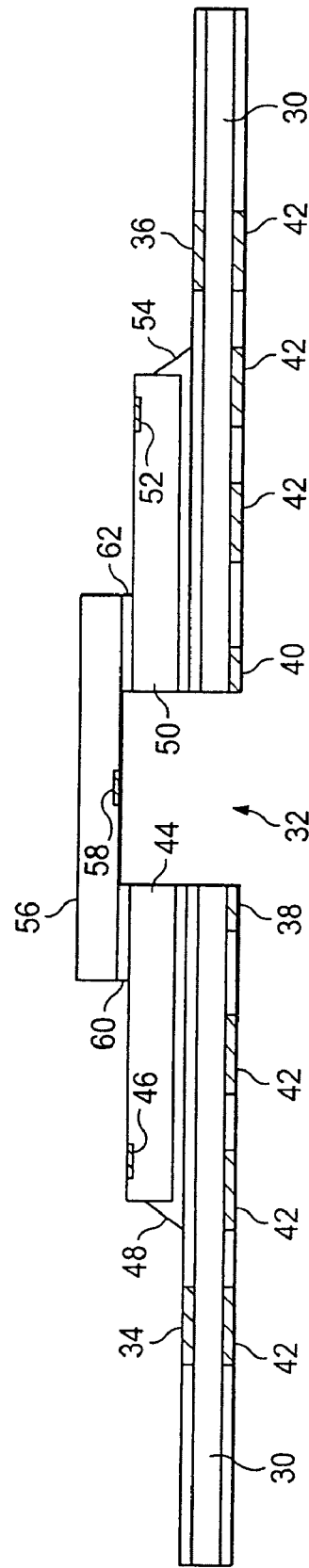
FIG. 1
FIG. 2A

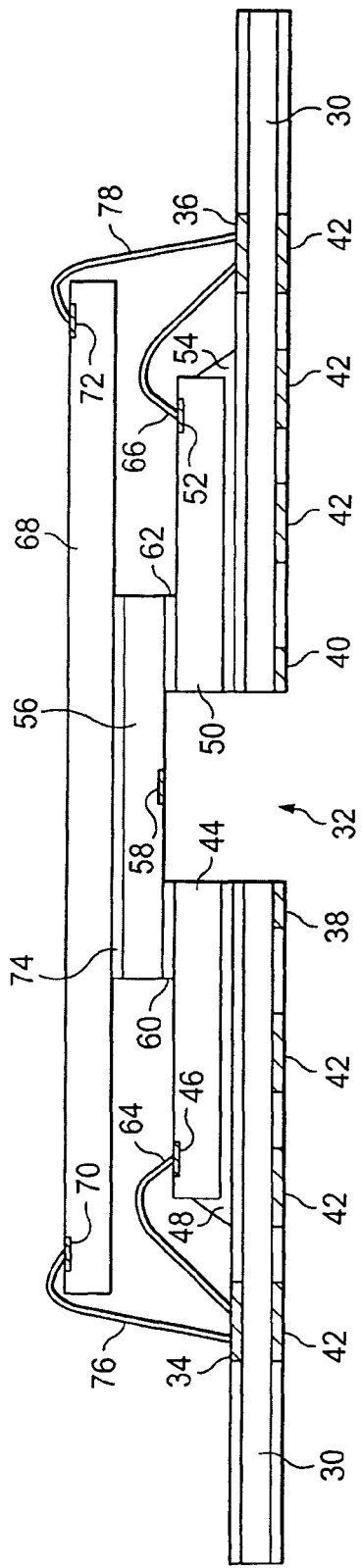
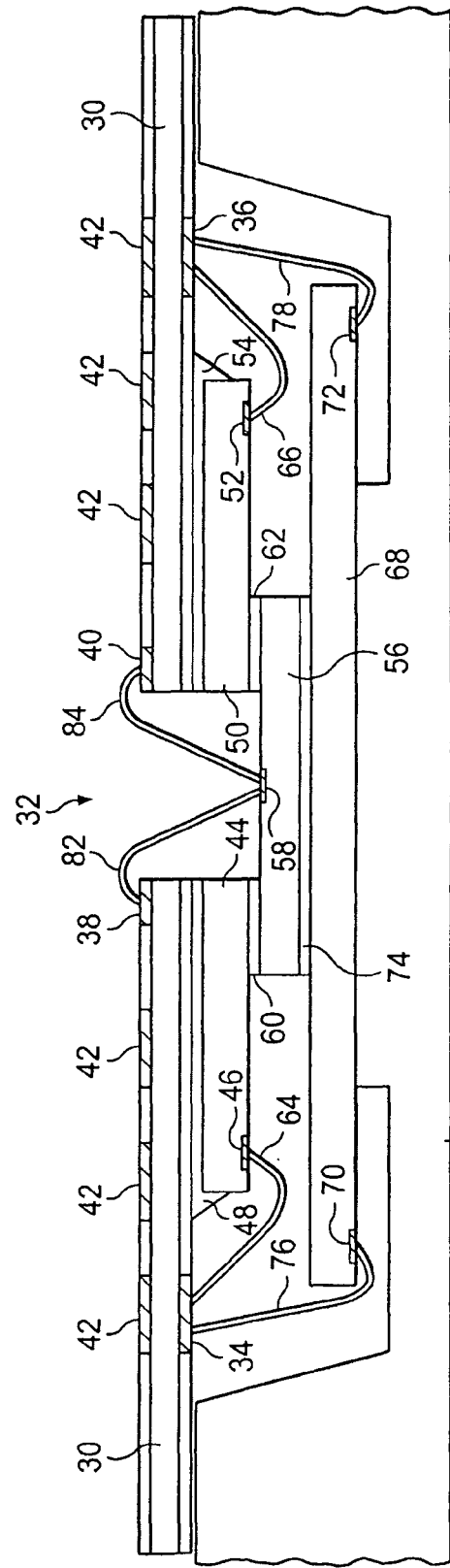

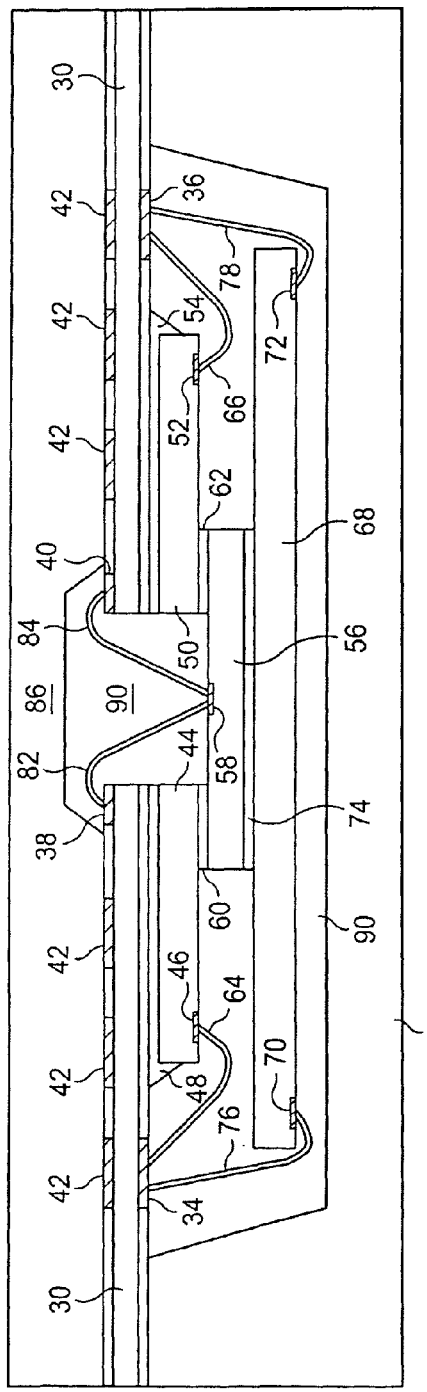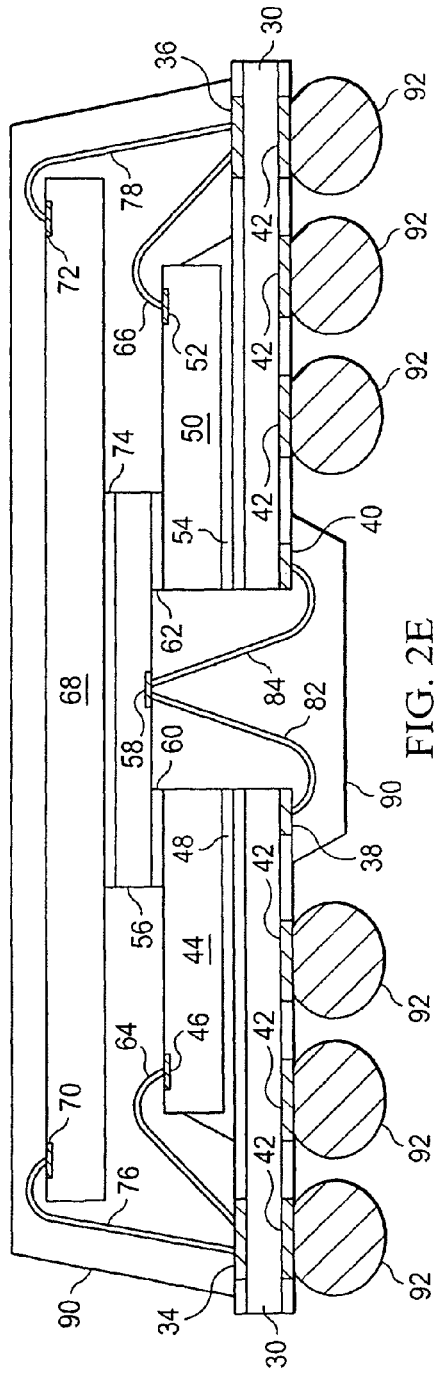

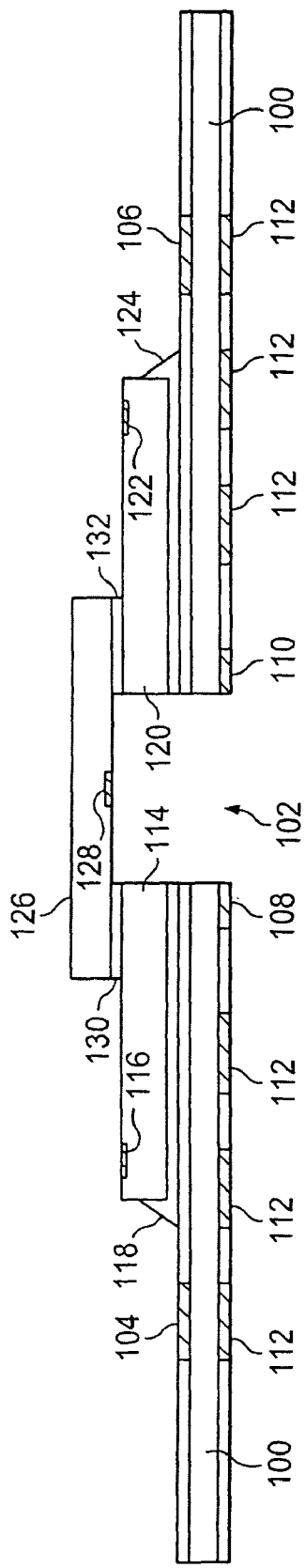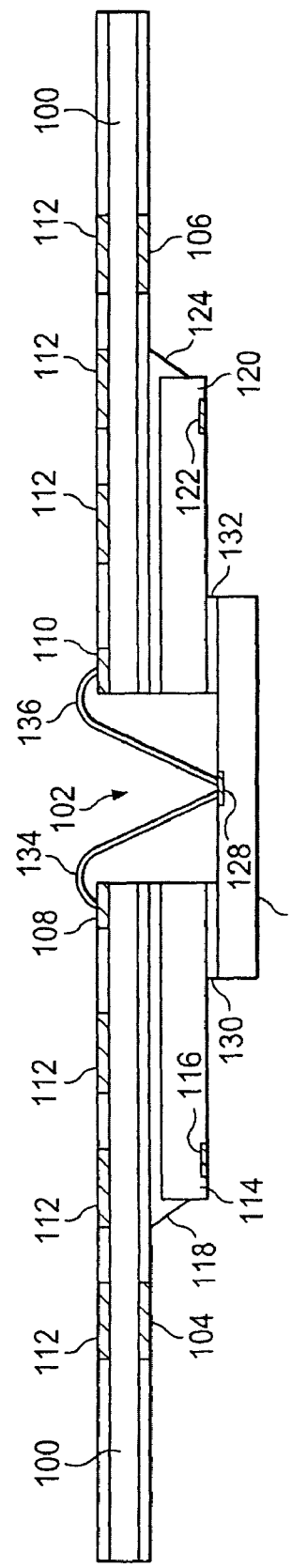
FIG. 3A
FIG. 3B

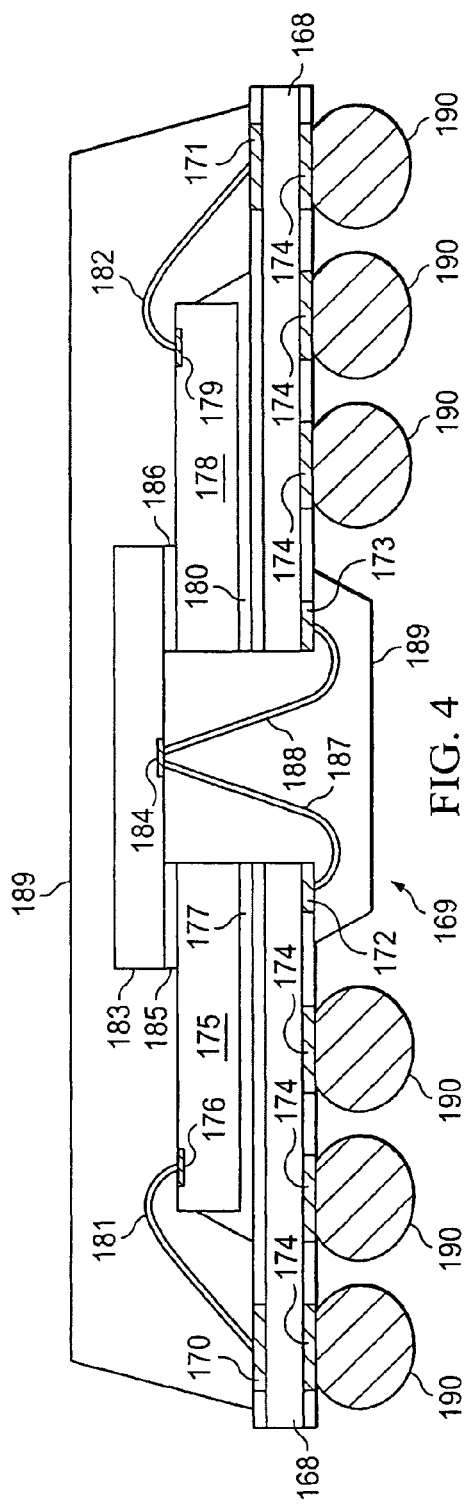
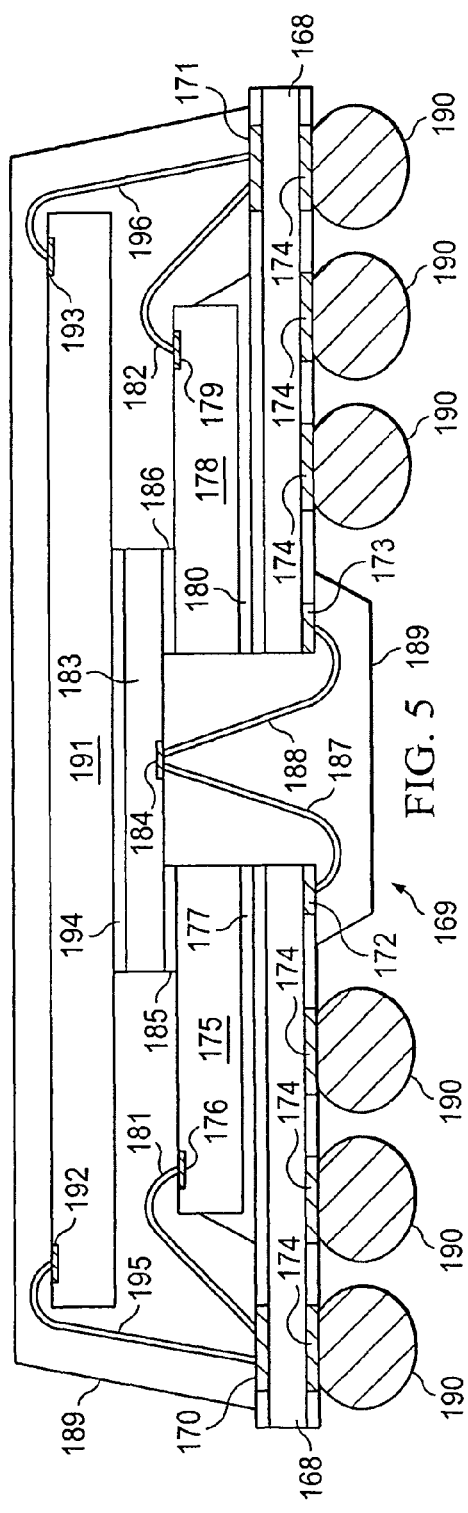

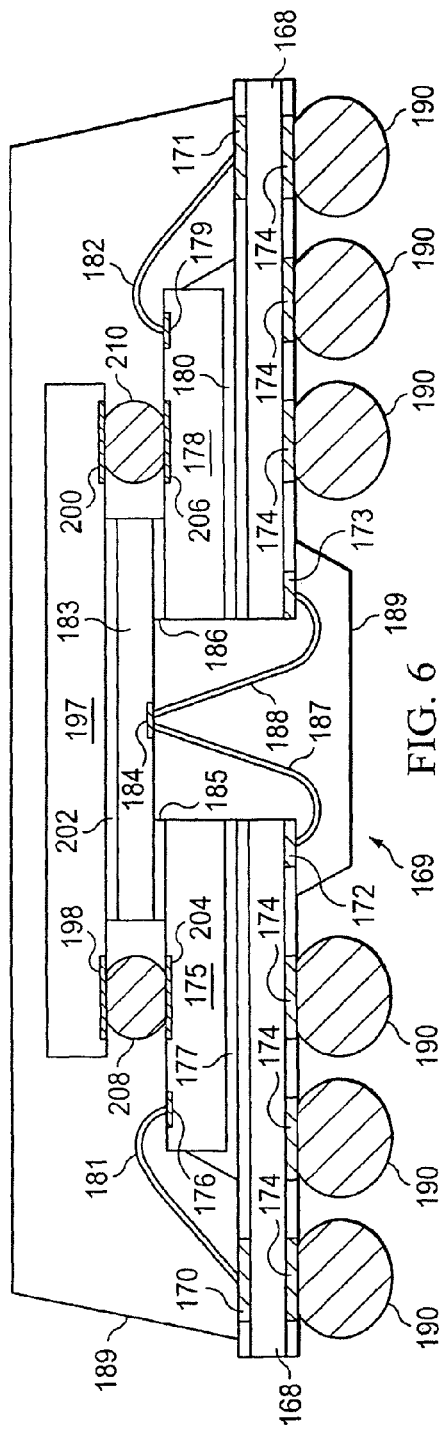
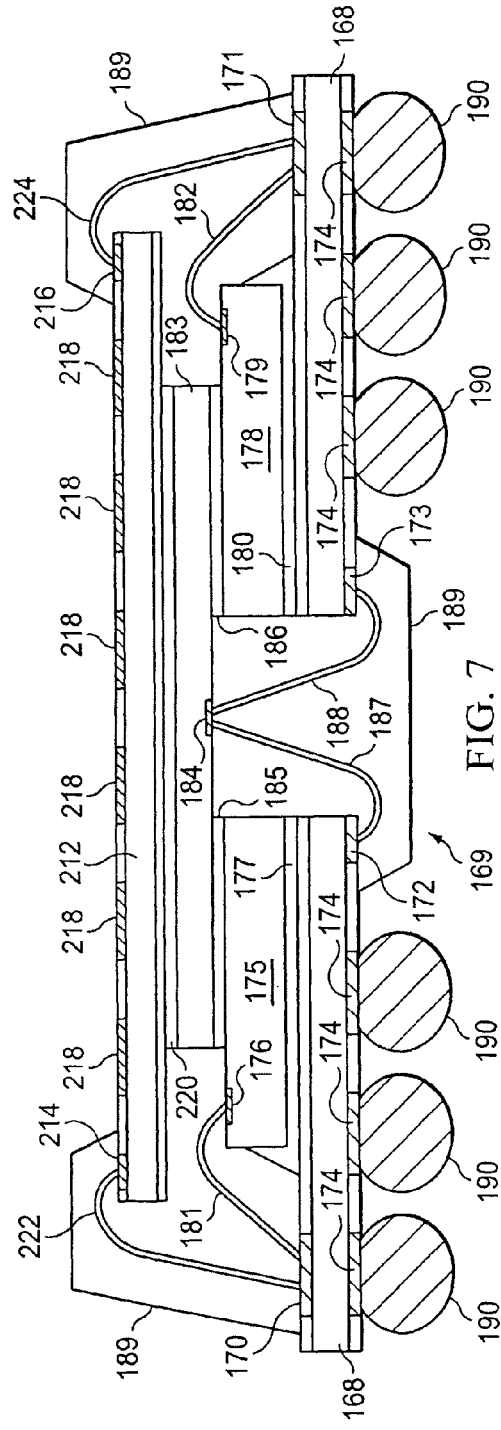
FIG. 6
FIG. 7

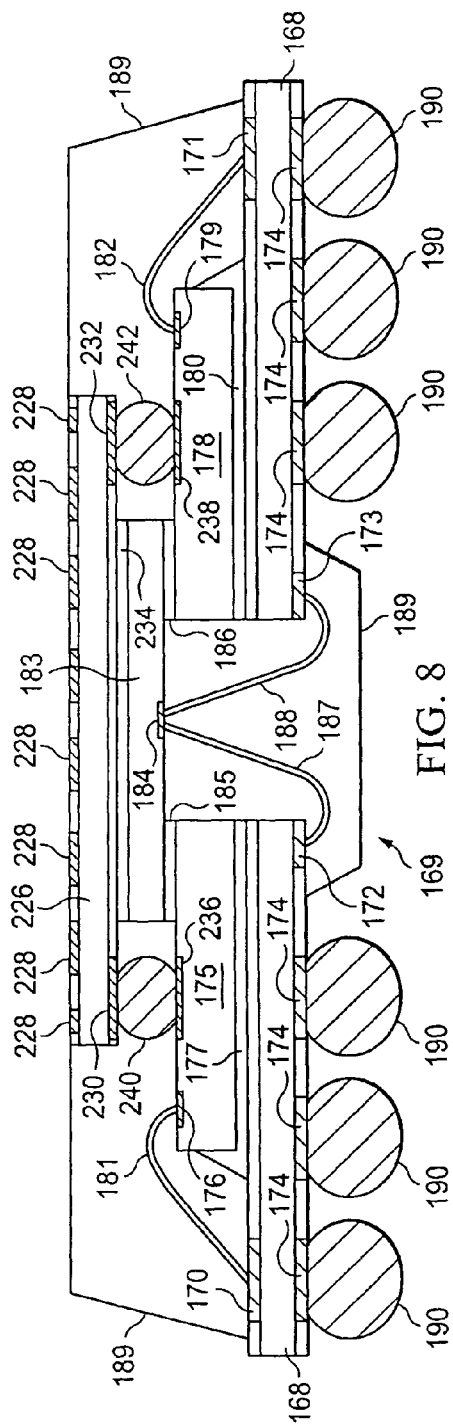
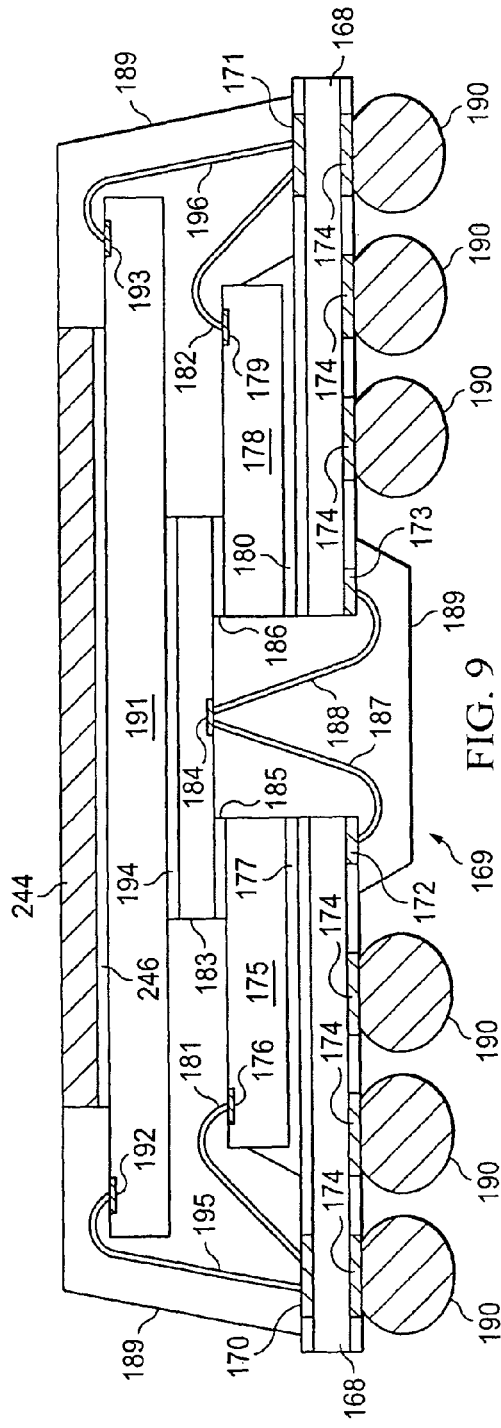

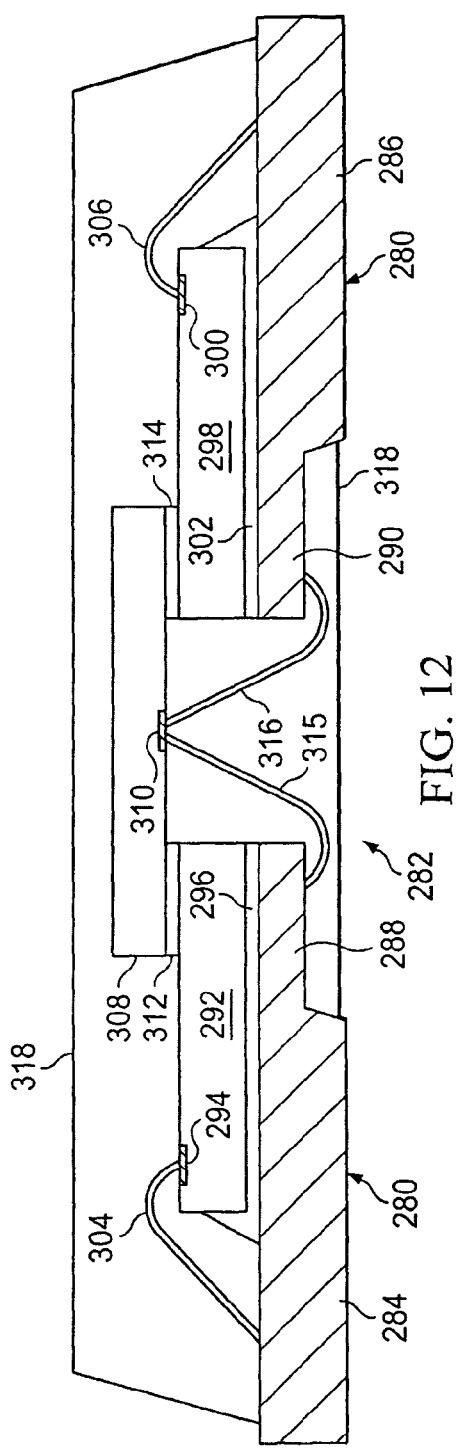
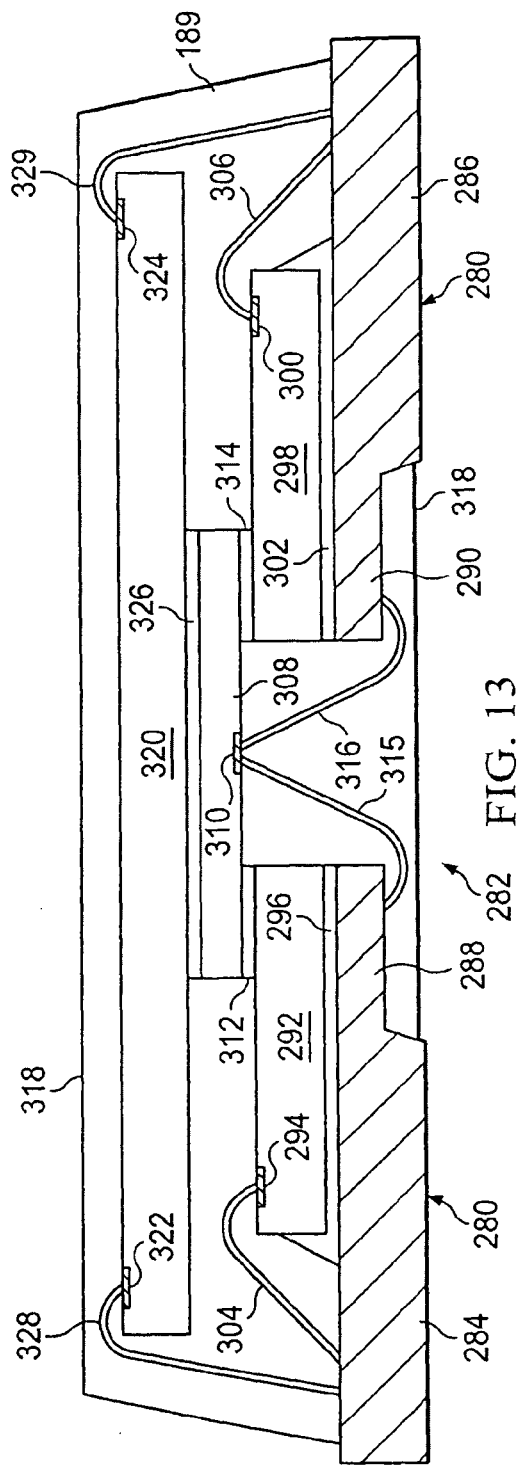
FIG. 12
FIG. 13

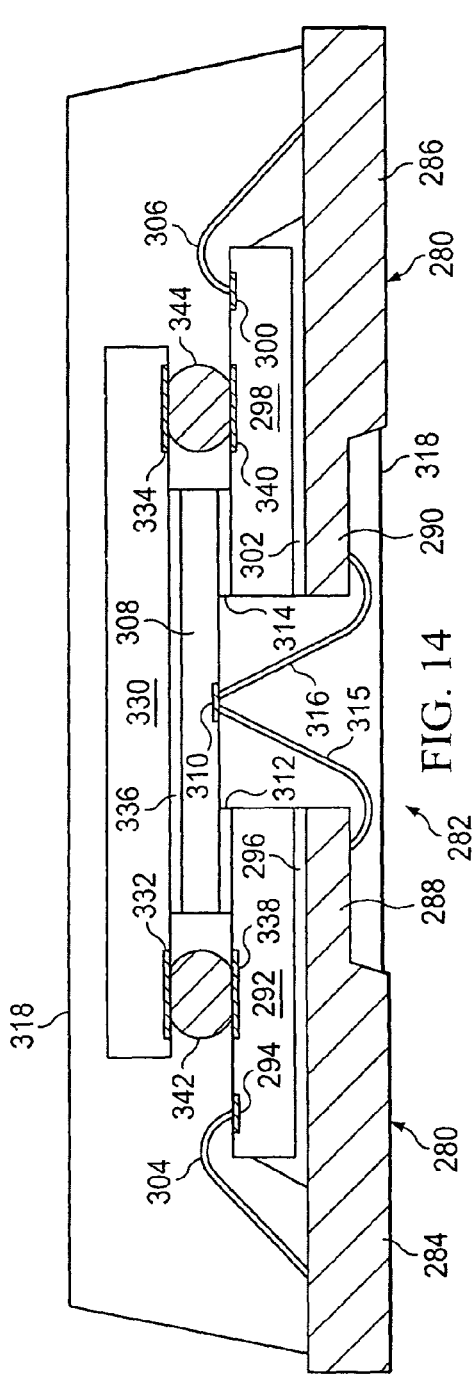
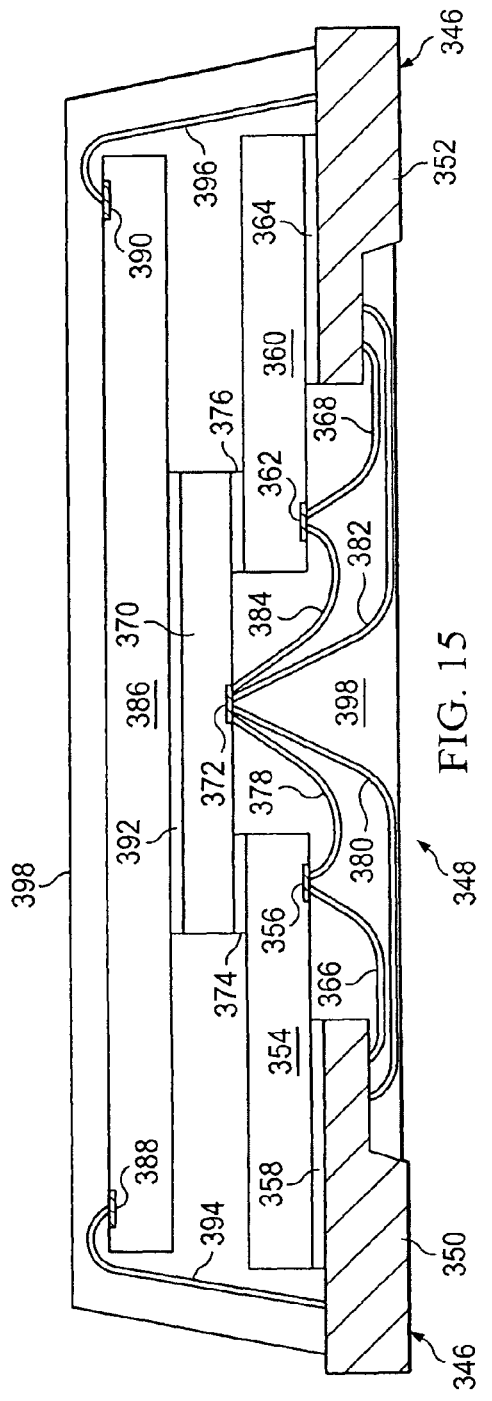

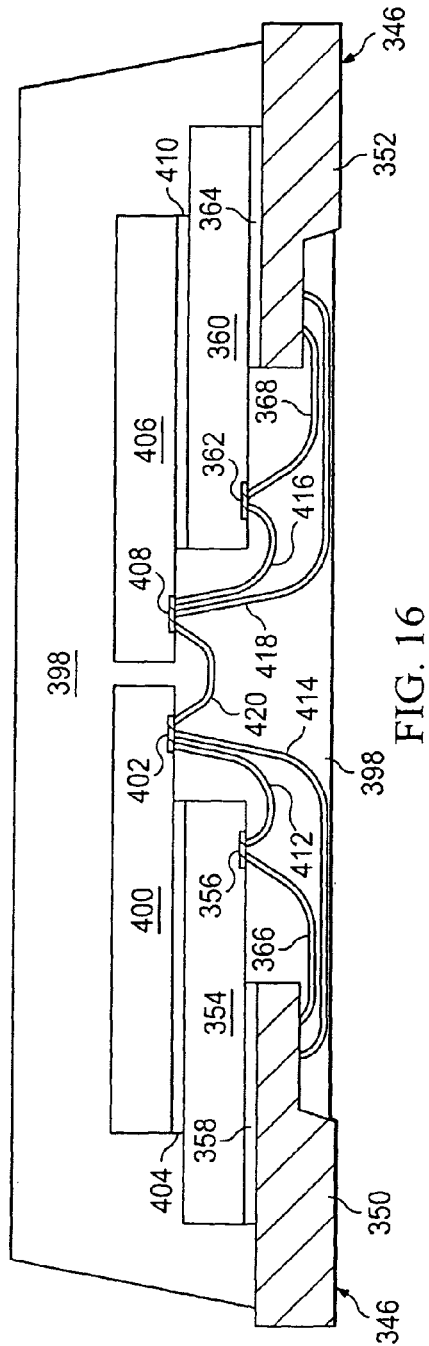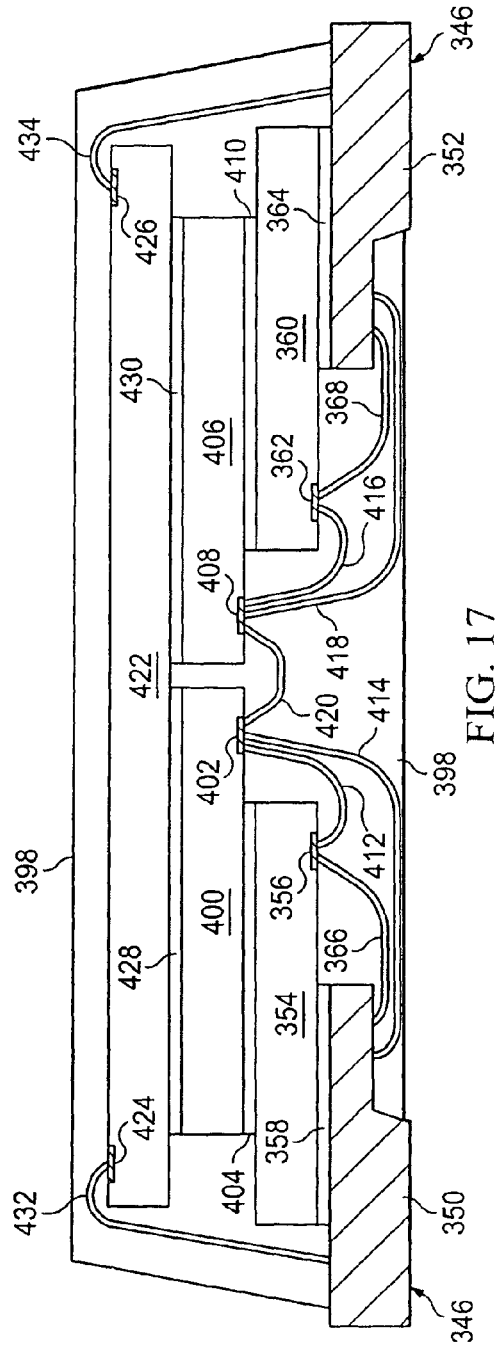

METHOD AND APPARATUS FOR A PACKAGE HAVING MULTIPLE STACKED DIE

FIELD OF THE INVENTION

The present invention relates in general to semiconductor devices and, more particularly, to an apparatus and method of fabricating a multiple-die system in a package (sip).

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). WLCSPs combine a plurality of semiconductor die, semiconductor packages, or known good units (KGUs) over a single substrate. However, space limitations minimize the number of dies that can be integrated over a single substrate. Also, prior systems make use of spacers or dummy layers to control the configuration of the semiconductor die, further limiting the number of semiconductor die that can be combined over a single substrate.

SUMMARY OF THE INVENTION

A need exists for a semiconductor device having a plurality of integrated semiconductor die over a substrate. In addition, a need exists for manufacturing techniques for the system as described which reduce process steps and material costs resulting in shorter cycle time and lower overall cost.

In one embodiment, the present invention is a method of manufacturing a semiconductor package comprising providing a substrate having a window, mounting first and second semiconductor devices to a top surface of the substrate on either side of the window using an adhesive, and mounting a third semiconductor device to the first and second semiconductor devices using an adhesive. The third semiconductor device is disposed over the window of the substrate. The method includes forming a wirebond between the third semiconductor device and a contact pad formed over a bottom surface of the substrate opposite the top surface of the substrate. The wirebond passes through the window of the substrate. The method includes depositing an encapsulant over the first, second, and third semiconductor devices.

In another embodiment, the present invention is a method of manufacturing a semiconductor package comprising providing a substrate having a window, stacking a plurality of semiconductor devices over a top surface of the substrate proximate to the window, and forming an electrical interconnect between one of the plurality of semiconductor devices and a contact pad formed over a bottom surface of the substrate opposite the top surface of the substrate. The electrical interconnect passes through the window of the substrate.

In another embodiment, the present invention is a method of manufacturing a semiconductor package comprising providing a substrate having a window, mounting a plurality of semiconductor devices over a top surface of the substrate proximate to the window of the substrate, forming an electrical interconnect between one of the plurality of semiconductor devices and a contact pad formed over a surface of the substrate, and depositing an encapsulant over the plurality of semiconductor devices using a two-step molding process.

In another embodiment, the present invention is a semiconductor package comprising a substrate having a window, a plurality of semiconductor devices stacked over a top surface of the substrate proximate to the window, and a wirebond formed between one of the plurality of semiconductor devices and a contact pad formed over a bottom surface of the substrate opposite the top surface of the substrate. The wirebond passes through the window of the substrate.

BRIEF DESCRIPTION OF THE DRAWINGS

FIG. 1 illustrates an example flip-chip mounted semiconductor device coupled to a substrate via a plurality of solder bumps;

FIGS. 2A-2E illustrate a first manufacturing process for forming a semiconductor device with a multiple-die system-in-a-package (SiP) structure;

FIGS. 3A-3E illustrate a second manufacturing process for forming a semiconductor device with a multiple-die SiP structure;

FIG. 4 illustrates an SiP including three die stacked over a substrate, the substrate and die are interconnected with wirebonds;

FIG. 5 illustrates an SiP with a plurality of die stacked in an overhang configuration over a substrate, the substrate and die are interconnected with wirebonds;

FIG. 6 illustrates an SiP with a plurality of die stacked over a substrate, the plurality of die include a flip-chip connected die;

FIG. 7 illustrates an SiP with a plurality of die stacked over a substrate, one of the plurality of die includes interconnect pads for forming a package-on-package (POP) device;

FIG. 8 illustrates an SiP with a plurality of die stacked over a substrate and includes a fan-in interposer disposed over the plurality of die;

FIG. 9 illustrates an SiP with a heat spreader deposited over a plurality of die stacked over a substrate;

FIG. 12 illustrates an SiP with a plurality of die stacked over a leadframe, the leadframe includes half-etch leads;

FIG. 13 illustrates an SiP with a plurality of die stacked over a leadframe in an overhang configuration, the leadframe includes half-etch leads;

FIG. 14 illustrates an SiP with a plurality of die stacked over a leadframe, the plurality of die include a flip-chip connected die;

FIG. 15 illustrates an SiP with a plurality of die stacked over a substrate in an overhang configuration with additional through-window wirebonds;

FIG. 16 illustrates an SiP with a plurality of die stacked over a leadframe in a staircase configuration;

FIG. 17 illustrates an SiP with a plurality of die stacked over a leadframe in a staircase configuration with an additional overhang die disposed over the plurality of die.

DETAILED DESCRIPTION OF THE DRAWINGS

Figure 3C:
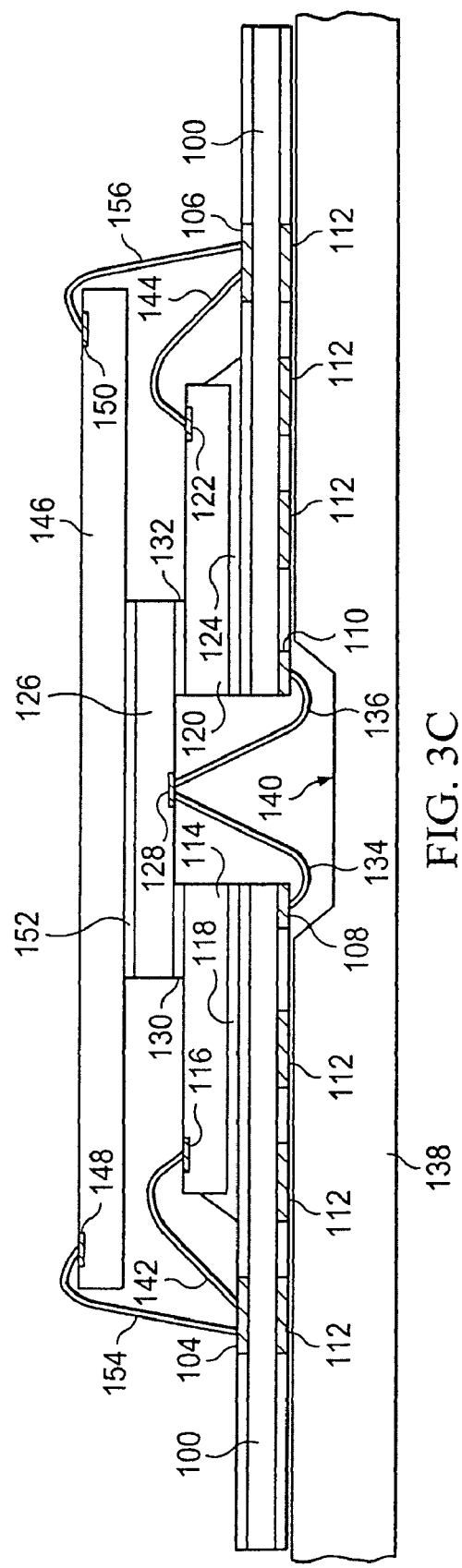

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor device system-in-a-package (SIP) having a plurality of integrated semiconductor die or packages can be manufactured. Moreover, the semiconductor device can be manufactured using a shorter process, using less costly materials which contribute to shorter manufacturing time and lower overall cost. In one embodiment, semiconductor die are mounted over a substrate and electronically interconnected. One or more semiconductor die is electronically connected to the substrate.

A mounted semiconductor device is shown in FIG. 1. The semiconductor device involves mounting an active area 12 of die 14 face down toward a chip carrier substrate or printed circuit board (PCB) 16. Active area 12 may contain active and passive devices, conductive layers, and dielectric layers according to the electrical design of die 14. The electrical and mechanical interconnect between die 14 and substrate or PCB 16 is achieved through a solder bump structure 20 comprising a large number of individual conductive solder bumps or balls 22. The solder bumps are formed on bump pads or interconnect sites 24, which are disposed on active area 12 of die 14. The bump pads 24 connect to the active circuits of die 14 by conduction tracks formed in active area 12. The solder bumps 22 are electrically and mechanically connected to contact pads or interconnect sites 26 on carrier substrate or PCB 16 by a solder reflow process. The semiconductor device provides a short electrical conduction path from the active devices on die 14 to conduction tracks on carrier substrate or PCB 16 in order to reduce signal propagation distance, lower capacitance, and achieve overall better circuit performance.

FIGS. 2A-2E illustrate a process for manufacturing an SiP with integrated semiconductor die or packages. Using the method, a plurality of die may be integrated over a single substrate. When mounting the die, rather than use spacers that take up vertical space, the die are stacked directly over one another using an adhesive. Many different die or IC chips may be combined over the substrate. They are connected to the substrate using wirebonding or another suitable mount technology. In one embodiment, the SiP device includes a cavity ball grid array (BGA) device with a plurality of dies disposed over a substrate. In another embodiment, the device includes a top package interconnect port for external known-good unit (KGU) or known-good-device (KGD) board-level stacking.

Turning to FIG. 2A, a first step in the manufacturing process is shown. Substrate 30 includes an epoxy-based laminate, printed circuit board, Bismaleimide-Triazine (BT) or other substrate material suitable for the connection of electronic components. Substrate 30 may include an interconnect structure to electronically connect a plurality of contact pads formed over a surface of substrate 30. Furthermore, substrate 30 may include one or more devices or circuits formed within substrate 30 or over a surface of substrate 30. Substrate 30 includes a center window or opening 32. A plurality of contact pads is formed over substrate 30. Contact pads 34 and 36 include a conductive material and are formed by a physical vapor deposition (PVD), chemical vapor deposition (CVD), electrolytic plating, or electroless plating process over a first side of substrate 30. Contact pads 38, 40, and 42 are formed over a second side of substrate 30. Die 44 is deposited over substrate 30. Die 44 includes packaged semiconductor dies and other electronic packages or integrated circuits (ICs) such as memory, controllers, application specific integrated circuits (ASICs), processors, microcontrollers, or combinations thereof. Contact pad 46 is formed over a surface of die 44 using a PVD, CVD, electrolytic plating, or electroless plating process and includes a conductive material. Underfill, die attach material, or adhesive 48 bonds die 44 to substrate 30. Die 50 having contact pad 52 is deposited over substrate 30 using adhesive 54. Die 56 is deposited over dies 44 and 50 using adhesive 60 and 62. Contact pad 58 is formed over a surface of die 56.

FIG. 2B illustrates a second step in manufacturing an SiP with integrated semiconductor die or packages. Wirebond 64 is formed between contact pad 46 of die 44 and contact pad 34 of substrate 30. In other embodiments, wirebonds may be replaced with alternative electrical interconnects such as solder bumps, pins, leads, and the like. Wirebond 64 includes a conductive material such as copper (Cu), aluminum (Al), gold (Au), or silver (Ag) and forms a physical and electrical connection between contact pad 46 and contact pad 32. Wirebond 66 is formed between contact pad 52 of die 50 and contact pad 36 of substrate 30. Die 68 is deposited over die 56 using adhesive 74. Contact pads 70 and 72 are formed over a surface of die 68. Wirebond 76 connects contact pad 70 of die 68 and contact pad 34 of substrate 30. Wirebond 78 connects contact pad 72 of die 68 and contact pad 36 of substrate 30.

FIG. 2C illustrates a third step in manufacturing an SiP with integrated semiconductor die or packages. The device is inverted and supported by boat 80. The shape of boat 80 is configured to support the device without damaging wirebonds 64, 66, 76, and 78. Wirebond 82 connects contact pad 38 of substrate 30 and contact pad 58 of die 56 through center window 32. Wirebond 84 connects contact pad 40 of substrate 30 and contact pad 58 of die 56.

FIG. 2D illustrates a fourth step in manufacturing an SiP with integrated semiconductor die or packages. Encapsulant 90 is deposited around the device. Encapsulant 90 includes a mold compound, epoxy molding compound, or other insulative material and provides physical support and electrical insulation to the various components of the device. Encapsulant 90 is deposited using an injection molding, transfer molding, cavity molding, or other molding process. Encapsulant 90 may further include a filler material to assist in matching the coefficient of thermal expansion (CTE) of encapsulant 90 to that of the dies or other structures deposited or formed over substrate 30. Molds 86 and 88 are placed around the device to facilitate deposition of encapsulant 90 and to control the placement and distribution of encapsulant 90.

FIG. 2E illustrates a final step in manufacturing an SiP with integrated semiconductor die or packages. Bumps 92 are formed over contact pads 42 of substrate 30. Bumps 92 are connected to contact pads 42 by a reflow process applied to solder material deposited over the contact pads. Bumps 92 include Au, or Cu structures or another conductive material such as tin/lead (Sn/Pb), copper/zinc (CuZn), or copper/silver (CuAg) solder each containing an optional flux material. The solder material is deposited using a ball drop or stencil printing process. Additional system components are connected to bumps 92 and thereby electronically connect to the circuits and devices formed within dies 44, 50, 56, or 68. The device is singulated by shearing, cutting, or routing to physically separate it from other devices formed over the same substrate 30 or another connected substrate.

FIGS. 3A-3E illustrate a second process for manufacturing an SiP with integrated semiconductor die or packages. Turning to FIG. 3A, a first step in the manufacturing process is shown. Substrate 100 includes a substrate material suitable for the connection of electronic components. Substrate 100 includes a center window or opening 102. A plurality of contact pads is formed over substrate 100. Contact pads 104 and 106 include a conductive material and are formed by a PVD, CVD, electrolytic plating, or electroless plating process over a first side of substrate 100. Contact pads 108, 110, and 112 are formed over a second side of substrate 100. Die 114 is deposited over substrate 100. Die 114 includes packaged semiconductor dies and other electronic packages or ICs. Contact pad 116 is formed over a surface of die 114 using a PVD, CVD, electrolytic plating, or electroless plating process and include a conductive material. Underfill, die attach material, or adhesive 118 bonds die 114 to substrate 100. Die 120 having contact pad 122 is deposited over substrate 100 using adhesive 124. Die 126 is deposited over dies 114 and 120 using adhesive 130 and 132. Contact pad 128 is formed over a surface of die 126.

Turning to FIG. 3B, the device is inverted and wirebond 134 is formed between contact pad 108 of substrate 100 and contact pad 128 of die 126. Wirebond 136 is formed between contact pad 110 of substrate 100 and contact pad 128 of die 126. Wirebonds 134 and 136 are formed through center window 102 of substrate 100.

In FIG. 3C, additional die and wirebonds are connected to the device. The device is supported by boat 138 during die and wirebond attach. Boat 138 includes a recess 140 to protect wirebonds 134 and 136. Wirebond 142 is formed between contact pad 116 of die 114 and contact pad 104 of substrate 100. Wirebond 144 is formed between contact pad 122 of die 120 and contact pad 106 of substrate 100. Die 146 is deposited over die 126 using adhesive 152. Contact pads 148 and 150 are formed over a surface of die 146. Wirebond 154 connects contact pad 148 of die 146 and contact pad 104 of substrate 100. Wirebond 156 connects contact pad 150 of die 146 and contact pad 106 of substrate 100.

Figure 3D:
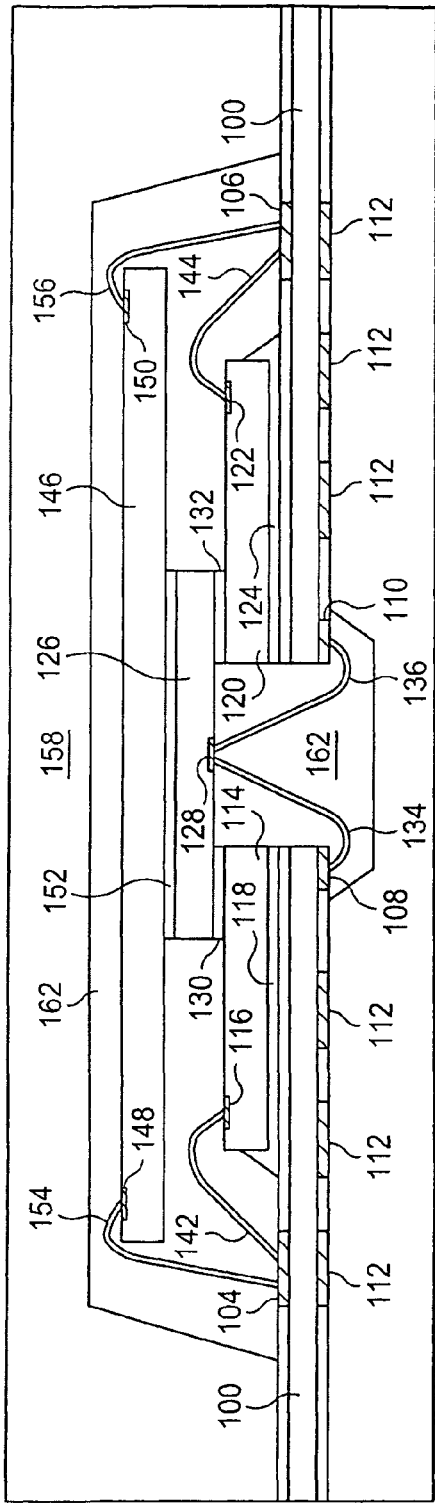

In FIG. 3D, a molding process is used to form encapsulant 162 around the device. Molds 158 and 160 are placed around the device to facilitate deposition of encapsulant 162 and to control the placement and distribution of encapsulant 162.

Figure 3E:
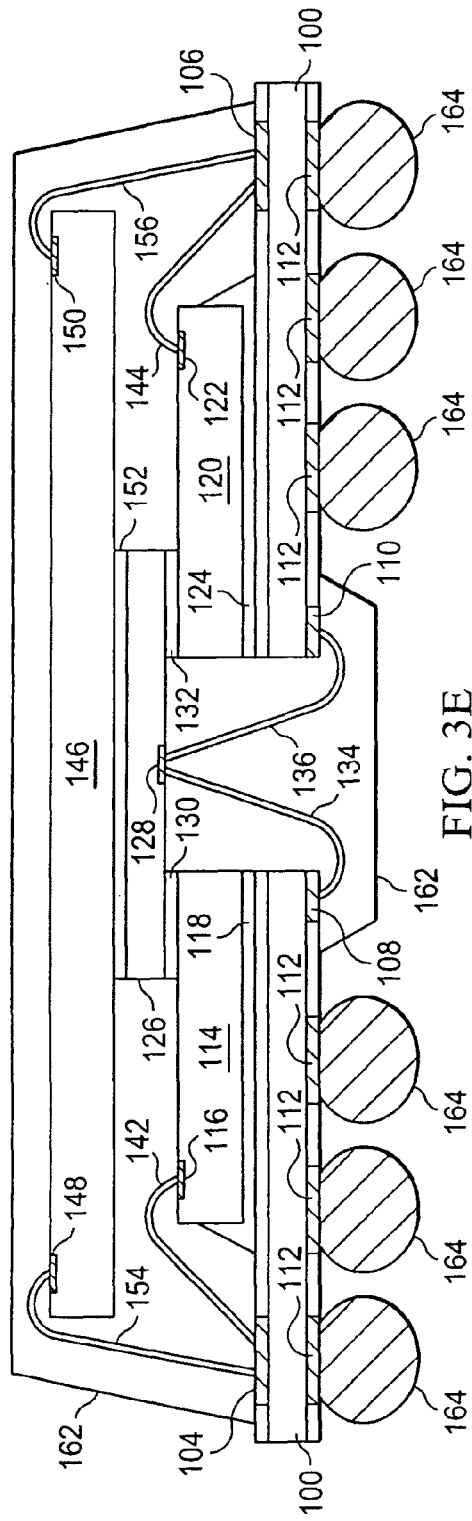

FIG. 3E illustrates a final step in the manufacturing process. Bumps 164 are formed over contact pads 112 of substrate 100. Bumps 164 are connected to contact pads 112 by a reflow process applied to solder material deposited over contact pads 112. The solder material is deposited using a ball drop or stencil printing process. Additional system components are connected to bumps 164 and thereby electronically connect to the circuits and devices formed within dies 114, 120, 126, and 146. The device is singulated by shearing, cutting, or routing to physically separate it from other devices formed over the same substrate 100 or another connected substrate.

In an alternative embodiment, a two-step molding process is used in place of boats 80 and 138. In the two step molding process, wirebonding is performed over one side of the device. That side of the device is then encapsulated. After the encapsulation, the opposite side of the device is wirebonded and encapsulated.

FIG. 4 illustrates an SiP having substrate 168. A plurality of contact pads is formed over substrate 168. Contact pads 170 and 171 are formed over a first side of substrate 168. Contact pads 172, 173 and 174 are formed over a second side of substrate 168. Die 175 having contact pad 176 is deposited over substrate 168 using underfill or adhesive 177. In one embodiment, die 175 includes a packaged controller device. Wirebond 181 connects contact pad 176 to contact pad 170 of substrate 168. Die 178 having contact pad 179 is deposited over substrate 168 using underfill or adhesive 180. In one embodiment, die 178 includes a static random access memory (SRAM) chip. Wirebond 182 connects contact pad 179 to contact pad 171 of substrate 168. Die 183 having contact pad 184 is deposited using adhesive 185 and 186 over both dies 175 and 178. In one embodiment, die 183 includes a packaged memory device. Wirebond 187 connects contact pad 184 of die 183 to contact pad 172 of substrate 168. Wirebond 188 connects contact pad 184 of die 183 to contact pad 173 of substrate 168. Encapsulant 189 is deposited over the device. As shown in FIG. 4, encapsulant 189 covers dies 175, 178, and 183, in addition to wirebonds 181, 182, 187, and 188. Bumps 190 are formed over contact pads 174 of substrate 168. Bumps 190 may be connected to additional system components.

Turning to FIG. 5, an SiP with an overhang stack is shown. The device includes substrate 168. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Die 191 having contact pads 192 and 193 is deposited over die 183 using adhesive 194. Wirebond 195 connects contact pad 192 of die 191 to contact pad 170 of substrate 168. Wirebond 196 connects contact pad 193 of die 191 to contact pad 171 of substrate 168.

FIG. 6 shows an SiP including a wafer-level chip scale package (WLCSP) or flip-chip stack. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Die 197 is deposited over die 183 using adhesive 202. Contact pads 198 and 200 are formed over a surface of die 197. Contact pads 198 and 200 include a conductive material and are formed using a PVD, CVD, electrolytic plating, or electroless plating process. Contact pad 204 is formed over a surface of die 175. Contact pad 206 is formed over a surface of die 178. A solder material is deposited between contact pads 198 and 204 and contact pads 200 and 206 and reflowed to form bumps 208 and 210. Bumps 208 and 210 form a mechanical and electrical connection between contact pads 198 and 204 and contact pads 200 and 206.

FIG. 7 illustrates an SiP with a fan-in interposer suitable for package-on-package (POP) applications. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Substrate or interposer 212 is deposited over die 183 using adhesive 220 and includes a rigid or flexible substrate material. Contact pads 214, 216, and 218 are formed over a surface of interposer 212. Wirebond 222 connects contact pad 214 of interposer 212 to contact pad 170 of substrate 168. Wirebond 224 connects contact pad 216 of interposer 212 to contact pad 171 of substrate 168. In one embodiment, contact pads 218 include a plurality of interconnect pads for POP applications. Accordingly, additional system components or KGDs may be stacked over interposer 212 and connected to contact pads 218 using solder bumps, wirebonds, or other mount technology.

FIG. 8 illustrates an SiP with a fan-in interposer connected to a die stack by conductive bumps. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Substrate or interposer 226 is deposited over die 183 using adhesive 234. Contact pads 230 and 232 are formed over a first surface of interposer 226 and contact pads 228 are formed over a second surface of interposer 226. Contact pad 236 is formed over a surface of die 175. Contact pad 238 is formed over a surface of die 178. A solder material is deposited between contact pads 230 and 236 and contact pads 232 and 238. The solder material is reflowed to form bumps 240 and 242. Bumps 240 and 242 mechanically connect contact pads 230 and 236 and contact pads 232 and 238. An interconnect structure electrically connects contact pads 228 to contact pads 230 and 232 and the devices formed within dies 175, 178, and 183. In one embodiment, additional system components connect to contact pads 228 of interposer 226 and are placed in electrical communication with the devices formed within dies 175, 178, and 183.

FIG. 9 illustrates an SiP with a stacked heat spreader. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Die 191 having contact pads 192 and 193 is deposited over die 183 using adhesive 194. Wirebond 195 connects contact pad 192 of die 191 to contact pad 170 of substrate 168. Wirebond 196 connects contact pad 193 of die 191 to contact pad 171 of substrate 168. Heat spreader 244 is connected to die 191 using adhesive 246. Heat spreader 244 includes a heat spreader and/or heat sink structure to remove heat energy from the device and to normalize heat distribution over a surface of die 191. Heat spreader 244 includes a metal such as Al or Cu or another material with high thermal conductivity.

Figure 10:
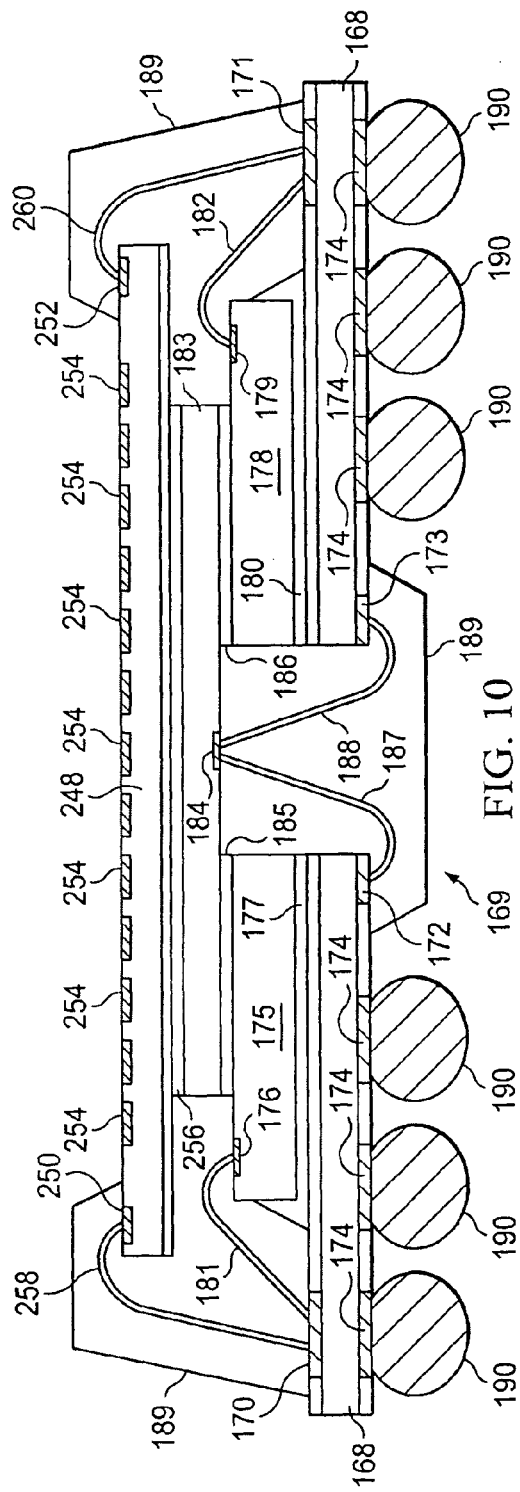
FIG. 10 illustrates an SiP with a plurality of die stacked over a substrate, the plurality of die include an exposed die for top interconnect.

FIG. 10 illustrates an SiP with a stacked die having exposed pads for POP interconnect. A plurality of contact pads is formed over substrate 168. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 187 connects contact pad 184 of die 183 to contact pad 172 of substrate 168. Wirebond 188 connects contact pad 184 of die 183 to contact pad 173 of substrate 168. Die 248 is deposited over die 183 using adhesive 256. Die 248 includes an IC die having a surface over which contact pads 250, 252 and 254 are formed. Contact pads 250, 252 and 254 include a conductive material and are formed using a PVD, CVD, electrolytic plating, or electroless plating process. Wirebond 258 connects contact pad 250 of die 248 to contact pad 170 of substrate 168. Wirebond 260 connects contact pad 252 of die 248 to contact pad 171 of substrate 168. Additional system devices, packages, or die may be connected to contact pads 254 of die 248. In one embodiment, an additional semiconductor package is flip-chip mounted to contact pads 254 of die 248. The deposition of encapsulant 189 is controlled to expose the contact pads formed over a surface of die 248.

Figure 11:
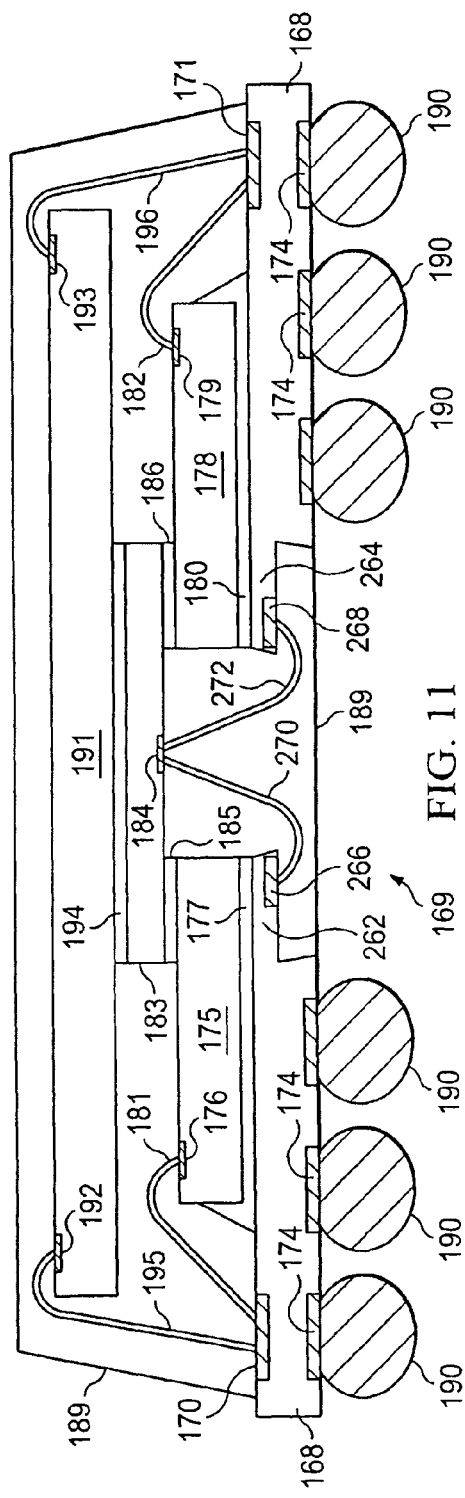
FIG. 11 illustrates an SiP with a plurality of die stacked over a substrate, an encapsulant with no mold protrusion is deposited over the plurality of die.

FIG. 11 illustrates an SiP without a mold or encapsulant protrusion. The device includes substrate 168. Substrate 168 includes recessed bond fingers 262 and 264 that are covered by encapsulant 189. Contact pads 266 and 268 are formed over bond fingers 262 and 264. Die 175 having contact pad 176 is deposited over substrate 168 using underfill or adhesive 177. Wirebond 181 connects contact pad 176 to contact pad 170 of substrate 168. Die 178 having contact pad 179 is deposited over substrate 168 using underfill or adhesive 180. Wirebond 182 connects contact pad 179 to contact pad 171 of substrate 168. Die 183 having contact pad 184 is deposited using adhesive 185 and 186 over both dies 175 and 178. Wirebond 270 connects contact pad 184 of die 183 to contact pad 266 of substrate 168. Wirebond 272 connects contact pad 184 of die 183 to contact pad 268 of substrate 168. Die 191 having contact pads 192 and 193 is deposited over die 183 using adhesive 194. Wirebond 195 connects contact pad 192 of die 191 to contact pad 170 of substrate 168. Wirebond 196 connects contact pad 193 of die 191 to contact pad 171 of substrate 168. Deposition of encapsulant 189 is controlled to prevent formation of a protrusion around a center window of substrate 168. In all embodiments including encapsulant, the deposition of encapsulant may be controlled to prevent the formation of such a protrusion. In an alternative embodiment, encapsulant 189 is initially deposited with a protrusion which is later removed using an etching or planarization process.

Turning to FIG. 12, the device includes semiconductor die deposited over leadframe 280. Leadframe 280 includes a conductive material such as Cu, or Al. Generally, the CTE of leadframe 280 is approximately matched to that of the dies, molding compound, and/or other structure deposited over leadframe 280. Leadframe 280 includes a center window or opening 282. As shown in FIG. 12, leadframe 280 includes half-etched leads 284 and 286 (the half-etched portion identified as 288 and 290) for improved physical integrity of the device. Die 292 having contact pad 294 is deposited over lead 284 of leadframe 280 using underfill, die attach material, or adhesive 296. In one embodiment, die 292 includes a packaged controller device. Wirebond 304 connects contact pad 294 of die 292 to lead 284. Die 298 having contact pad 300 is deposited over lead 286 of leadframe 280 using adhesive 302. In one embodiment, die 298 includes an SRAM chip. Wirebond 306 connects contact pad 300 of die 298 to lead 286. Die 308 having contact pad 310 is deposited over dies 292 and 298 using adhesive 312 and 314. In one embodiment, die 308 includes a memory IC. Wirebond 315 connects contact pad 310 to lead 284 of leadframe 280. Wirebond 316 connects contact pad 310 to lead 286 of leadframe 280. Wirebonds 315 and 316 are formed through window 282 of leadframe 280. Encapsulant 318 is deposited over dies 292, 298, and 308, and leadframe 280. Encapsulant 318 includes a mold compound, epoxy molding compound, or other insulative material and provides physical support and electrical insulation to the various components of the device. Encapsulant 318 is deposited using an injection molding, transfer molding, cavity molding, or other molding process. Encapsulant 318 may further include a filler material to assist in matching the CTE of encapsulant 318 to that of the dies or other structure deposited over leadframe 280.

Turning to FIG. 13, an SiP with a half-etch leadframe and an overhang stack is illustrated. Die 292 having contact pad 294 is deposited over lead 284 of leadframe 280 using underfill, die attach material, or adhesive 296. Wirebond 304 connects contact pad 294 of die 292 to lead 284. Die 298 having contact pad 300 is deposited over lead 286 of leadframe 280 using adhesive 302. Wirebond 306 connects contact pad 300 of die 298 to lead 286. Die 308 having contact pad 310 is deposited over dies 292 and 298 using adhesive 312 and 314. Wirebond 315 connects contact pad 310 to lead 284 of leadframe 280. Wirebond 316 connects contact pad 310 to lead 286 of leadframe 280. Die 320 having contact pads 322 and 324 is deposited over die 308 using adhesive 326. Wirebond 328 connects contact pad 322 of die 320 to lead 284 of leadframe 280. Wirebond 329 connects contact pad 324 of die 320 to lead 286 of leadframe 280.

FIG. 14 shows an SiP with a half-etch leadframe and WLCSP or flip-chip stack. Die 292 having contact pad 294 is deposited over lead 284 of leadframe 280 using underfill, die attach material, or adhesive 296. Wirebond 304 connects contact pad 294 of die 292 to lead 284. Die 298 having contact pad 300 is deposited over lead 286 of leadframe 280 using adhesive 302. Wirebond 306 connects contact pad 300 of die 298 to lead 286. Die 308 having contact pad 310 is deposited over dies 292 and 298 using adhesive 312 and 314. Wirebond 315 connects contact pad 310 to lead 284 of leadframe 280. Wirebond 316 connects contact pad 310 to lead 286 of leadframe 280. Die 330 having contact pads 332 and 334 is mounted over die 308 using adhesive 336. Contact pad 338 includes a conductive material and is formed over a surface of die 292. Contact pad 340 is formed over a surface of die 298. Contact pads 338 and 340 may include redistributed UBM pads to facilitate the connection and reflow of solder material over a surface of contact pads 338 and 340. Solder material is deposited between contact pads 332 and 338 and contact pads 334 and 340 and is reflowed to form bumps 342 and 344. Bumps 342 and 344 form a mechanical and electrical connection between contact pads 332 and 338 and contact pads 334 and 340.

Turning to FIG. 15, an SiP with an overhang stack and leadframe 346 is illustrated. Leadframe 346 includes a conductive material such as Cu, or Al. Generally, the CTE of leadframe 346 is approximately matched to that of the dies, molding compound, and/or other structure deposited over leadframe 346. Leadframe 346 includes a center window or opening 348. As shown in FIG. 15, leadframe 346 includes half-etched leads 350 and 352 for improved physical integrity of the device. Die 354 having contact pad 356 is deposited over lead 350 using underfill, die attach material, or adhesive 358. In one embodiment, die 354 includes a packaged controller device. Wirebond 366 connects contact pad 356 of die 354 to lead 350. Die 360 having contact pad 362 is deposited over lead 352 using adhesive 364. In one embodiment, die 360 includes an SRAM chip. Wirebond 368 connects contact pad 362 of die 360 to lead 352. Die 370 having contact pad 372 is deposited over dies 354 and 360 using adhesive 374 and 376. In one embodiment, die 370 includes a memory IC. Wirebond 378 connects contact pad 372 of die 370 to contact pad 356 of die 354. Wirebond 380 connects contact pad 372 of die 370 to lead 350. Wirebond 382 connects contact pad 372 of die 370 to lead 352. Wirebond 384 connects contact pad 372 of die 370 to contact pad 362 of die 360. Die 386 having contact pads 388 and 390 is deposited over die 370 using adhesive 392. Wirebond 394 connects contact pad 388 of die 386 to lead 350. Wirebond 396 connects contact pad 390 of die 386 to lead 352. Over dies 354, 360, 370, and 386 and leadframe 346, encapsulant 398 is deposited. Encapsulant 398 includes a mold compound, epoxy molding compound, or other insulative material and provides physical support and electrical insulation to the various components of the device. Encapsulant 398 is deposited using an injection molding, transfer molding, cavity molding, or other molding process. Encapsulant 398 may further include a filler material to assist in matching the CTE of encapsulant 398 to that of the dies or other structure deposited over leadframe 346.

FIG. 16 illustrates an SiP with a staircase stack. Die 354 having contact pad 356 is deposited over lead 350 using underfill, die attach material, or adhesive 358. In one embodiment, die 354 includes a packaged controller device. Wirebond 366 connects contact pad 356 of die 354 to lead 350. Die 360 having contact pad 362 is deposited over lead 352 using adhesive 364. In one embodiment, die 360 includes an SRAM chip. Wirebond 368 connects contact pad 362 of die 360 to lead 352. Die 400 having contact pad 402 is deposited over die 354 using adhesive 404. Wirebond 412 connects contact pad 402 of die 400 to contact pad 356 of die 354. Wirebond 414 connects contact pad 402 of die 400 to lead 350. Die 406 having contact pad 408 is deposited over die 360 using adhesive 410. Wirebond 416 connects contact pad 408 of die 406 to contact pad 362 of die 360. Wirebond 418 connects contact pad 408 of die 406 to lead 352. Wirebond 420 connects connect pad 402 of die 400 to contact pad 408 of die 406.

FIG. 17 illustrates an SiP with a staircase stack and overhang stack. Die 354 having contact pad 356 is deposited over lead 350 using underfill, die attach material, or adhesive 358.

In one embodiment, die 354 includes a packaged controller device. Wirebond 366 connects contact pad 356 of die 354 to lead 350. Die 360 having contact pad 362 is deposited over lead 352 using adhesive 364. In one embodiment, die 360 includes an SRAM chip. Wirebond 368 connects contact pad 362 of die 360 to lead 352. Die 400 having contact pad 402 is deposited over die 354 using adhesive 404. Wirebond 412 connects contact pad 402 of die 400 to contact pad 356 of die 354. Wirebond 414 connects contact pad 402 of die 400 to lead 350. Die 406 having contact pad 408 is deposited over die 360 using adhesive 410. Wirebond 416 connects contact pad 408 of die 406 to contact pad 362 of die 360. Wirebond 418 connects contact pad 408 of die 406 to lead 352. Wirebond 420 connects connect pad 402 of die 400 to contact pad 408 of die 406. Die 422 having contact pads 424 and 426 is deposited over dies 400 and 406 using adhesive 428 and 430. Wirebond 432 connects contact pad 424 of die 422 to lead 350. Wirebond 434 connects contact pad 426 of die 422 to lead 352.

Figure 18:
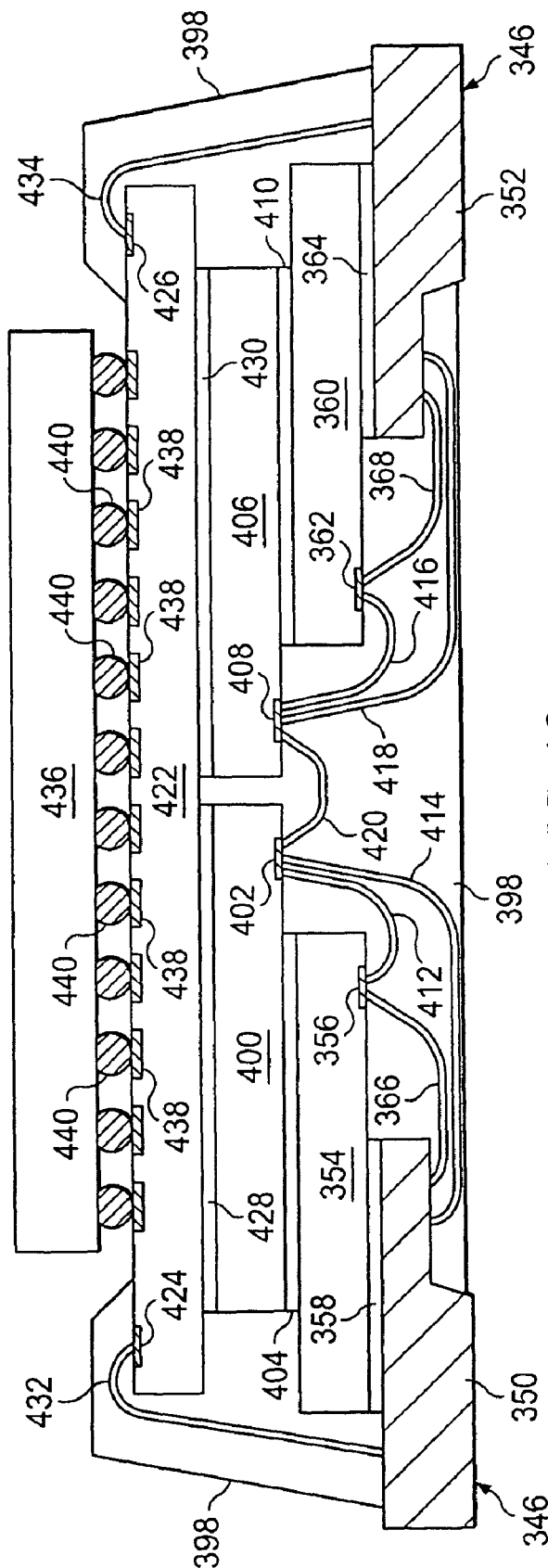
FIG. 18 illustrates an SiP with a plurality of die stacked over a leadframe having half-etched leads, the plurality of die include an exposed die for top interconnect.

FIG. 18 illustrates an SiP with an exposed die or laminate interposer for top interconnect. Die 354 having contact pad 356 is deposited over lead 350 using underfill, die attach material, or adhesive 358. In one embodiment, die 354 includes a packaged controller device. Wirebond 366 connects contact pad 356 of die 354 to lead 350. Die 360 having contact pad 362 is deposited over lead 352 using adhesive 364. In one embodiment, die 360 includes an SRAM chip. Wirebond 368 connects contact pad 362 of die 360 to lead 352. Die 400 having contact pad 402 is deposited over die 354 using adhesive 404. Wirebond 412 connects contact pad 402 of die 400 to contact pad 356 of die 354. Wirebond 414 connects contact pad 402 of die 400 to lead 350. Die 406 having contact pad 408 is deposited over die 360 using adhesive 410. Wirebond 416 connects contact pad 408 of die 406 to contact pad 362 of die 360. Wirebond 418 connects contact pad 408 of die 406 to lead 352. Wirebond 420 connects connect pad 402 of die 400 to contact pad 408 of die 406. Die 422 having contact pads 424 and 426 is deposited over dies 400 and 406 using adhesive 428 and 430. Wirebond 432 connects contact pad 424 of die 422 to lead 350. Wirebond 434 connects contact pad 426 of die 422 to lead 352. A plurality of contact pads 438 are formed over a top surface of die 422 using a PVD, CVD, electrolytic plating, or electroless plating process. Deposition of encapsulant 398 is controlled to expose the top surface of die 422 and contact pads 438 formed thereon. Die 436 is deposited over the top surface of die 422 using a surface mount technology (SMT). In FIG. 18, die 436 is a flip-chip mounted to die 422 using bumps 440. Solder material is deposited between contact pads or UBM pads (not shown) formed over a surface of die 436 and contact pads 438. The solder material is then reflowed to form bumps 440 that form a mechanical and electrical bond between die 436 and die 422.

Semiconductor devices in the various embodiments shown can be manufactured using tools and equipment commonly known in the art, such as wire bonding, patterning, etching and similar equipment. Semiconductor devices serve to continue to advance integrated passive device technology at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:
   providing a substrate including a window;
   disposing first and second semiconductor devices on a first surface of the substrate on either side of the window using an adhesive;
   disposing a third semiconductor device on the first and second semiconductor devices using an adhesive, the third semiconductor device being disposed over the window of the substrate;
   forming a wirebond between the third semiconductor device and a contact pad formed over a second surface of the substrate opposite the first surface of the substrate, the wirebond passing through the window of the substrate; and
   depositing an encapsulant over the first, second, and third semiconductor devices.

2. The method of claim 1, wherein the encapsulant includes a coefficient of thermal expansion (CTE) substantially equal to a CTE of the first, second, or third semiconductor device.

3. The method of claim 1, further including forming the wirebond between the third semiconductor device and the contact pad by supporting the semiconductor package in a boat.

4. The method of claim 1, further including depositing the encapsulant over the first, second, and third semiconductor devices in a two-step molding process.

5. The method of claim 1, further including disposing a heat spreader over the semiconductor package.

6. The method of claim 1, further including depositing an interposer or semiconductor component over the first, second, or third semiconductor device, the interposer or semiconductor component including a plurality of contact pads formed over a first surface of the interposer or semiconductor component for connection of additional system components.

7. The method of claim 1, further including providing the substrate as a leadframe comprising half-etched leads.

8. A method of making a semiconductor package, comprising:
   providing a substrate including a window;
   stacking a plurality of semiconductor devices over a first surface of the substrate proximate to the window; and
   forming an electrical interconnect between one of the plurality of semiconductor devices and a contact pad formed over a second surface of the substrate opposite the first surface of the substrate, the electrical interconnect passing through the window of the substrate.

9. The method of claim 8, wherein stacking the plurality of semiconductor devices over the substrate includes:
   disposing first and second semiconductor devices on the substrate using an adhesive; and
   disposing a third semiconductor device on the first and second semiconductor devices, the third semiconductor device being disposed over the window.

10. The method of claim 8, further including depositing an encapsulant over the plurality of semiconductor devices, the encapsulant including a coefficient of thermal expansion (CTE) substantially equal to a CTE of one of the plurality of semiconductor devices.

11. The method of claim 10, further including depositing the encapsulant over the plurality of semiconductor devices in a two-step molding process.

12. The method of claim 8, further including disposing a heat spreader over the semiconductor package.

13. The method of claim 8, further including disposing an interposer or semiconductor component over the plurality of semiconductor devices, the interposer or semiconductor component including a plurality of contact pads formed over a first surface of the interposer or semiconductor component for connection of additional system components.

14. A method of making a semiconductor package, comprising:
providing a substrate including a window, wherein the substrate includes a leadframe, the leadframe comprising half-etched leads;
stacking a plurality of semiconductor devices over a first surface of the substrate proximate to the window; and
forming an electrical interconnect between one of the plurality of semiconductor devices and a contact pad formed over a second surface of the substrate opposite the first surface of the substrate, the electrical interconnect passing through the window of the substrate.

15. The method of claim 14, wherein stacking the plurality of semiconductor devices over the substrate includes:
disposing first and second semiconductor devices on the substrate using an adhesive; and
disposing a third semiconductor device on the first and second semiconductor devices, the third semiconductor device being disposed over the window.

16. The method of claim 14, further including depositing an encapsulant over the plurality of semiconductor devices, the encapsulant including a coefficient of thermal expansion (CTE) substantially equal to a CTE of one of the plurality of semiconductor devices.

17. The method of claim 14, further including depositing an encapsulant over the plurality of semiconductor devices in a two-step molding process.

18. The method of claim 14, further including disposing a heat spreader over the semiconductor package.

19. The method of claim 14, further including disposing an interposer or semiconductor component over the plurality of semiconductor devices, the interposer or semiconductor component including a plurality of contact pads formed over a first surface of the interposer or semiconductor component for connection of additional system components.

20. A method of making a semiconductor package, comprising:
providing a substrate including a window;
disposing a plurality of semiconductor devices over a first surface of the substrate proximate to the window of the substrate;
forming an electrical interconnect between one of the plurality of semiconductor devices and a contact pad formed over a surface of the substrate; and
depositing an encapsulant over the plurality of semiconductor devices using a two-step molding process.

21. The method of claim 20, wherein disposing the plurality of semiconductor devices over the substrate includes:
disposing first and second semiconductor devices on the first surface of the substrate using an adhesive; and
disposing a third semiconductor device to the first and second semiconductor devices, the third semiconductor device being disposed over the window of the substrate.

22. The method of claim 20, wherein the encapsulant includes a coefficient of thermal expansion (CTE) substantially equal to a CTE of one of the plurality of semiconductor devices.

23. The method of claim 20, further including disposing a heat spreader over the semiconductor package.

24. The method of claim 20, further including disposing an interposer or semiconductor component over the plurality of semiconductor devices, the interposer or semiconductor component including a plurality of contact pads formed over a first surface of the interposer or semiconductor component for connection of additional system components.

25. The method of claim 20, further including providing the substrate as a leadframe including half-etched leads.

26. A method of making a semiconductor package, comprising:
providing a substrate including a window;
disposing first and second semiconductor devices over a first surface of the substrate proximate to the window of the substrate; and
disposing a third semiconductor device to the first and second semiconductor devices and over the window of the substrate.

27. The method of claim 26, further including forming an electrical interconnect between one of the first, second, or third semiconductor devices and the substrate.

28. The method of claim 26, further including depositing an encapsulant over the first, second, and third semiconductor devices, the encapsulant including a coefficient of thermal expansion (CTE) substantially equal to a CTE of one of the first, second, or third semiconductor devices.

29. The method of claim 26, further including disposing a heat spreader over the semiconductor package.

30. The method of claim 26, further including disposing an interposer or semiconductor component over the third semiconductor device, the interposer or semiconductor component including a plurality of contact pads formed over a first surface of the interposer or semiconductor component for connection of additional system components.

* * * * *